(12) United States Patent
Gerber et al.

(10) Patent No.: US 8,133,761 B2
(45) Date of Patent: Mar. 13, 2012

(54) PACKAGED SYSTEM OF SEMICONDUCTOR CHIPS HAVING A SEMICONDUCTOR INTERPOSER

(75) Inventors: Mark A Gerber, Lucas, TX (US); Kurt P Wachtler, Richardson, TX (US); Abram M. Castro, Fort Worth, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/486,596

(22) Filed: Jun. 17, 2009

(65) Prior Publication Data

US 2009/0258459 A1  Oct. 15, 2009

Related U.S. Application Data

(60) Continuation of application No. 12/119,276, filed on May 12, 2008, now Pat. No. 7,573,139, which is a division of application No. 11/400,099, filed on Apr. 7, 2006, now Pat. No. 7,390,700.

(51) Int. Cl.
H01L 21/44 (2006.01)

(52) U.S. Cl. .............. 438/108; 438/113; 257/E21.499

(58) Field of Classification Search ............ 257/678, 257/690, 777, 778, 723, 738, E21.503, 734–737, 257/780–781, 686, 787; 438/106–108
See application file for complete search history.

(56) References Cited

U.S. PATENT DOCUMENTS

| | | | |
|---|---|---|---|
| 6,815,254 B2 | 11/2004 | Mistry et al. | |
| 6,933,612 B2 | 8/2005 | Kimura | |
| 7,268,418 B2 | 9/2007 | Wang | |
| 7,605,463 B2 * | 10/2009 | Sunohara et al. | 257/700 |
| 7,659,623 B2 * | 2/2010 | Watanabe et al. | 257/778 |
| 2003/0134450 A1 | 7/2003 | Lee | |
| 2004/0178508 A1 * | 9/2004 | Nishimura et al. | 257/778 |
| 2006/0001179 A1 | 1/2006 | Fukase et al. | |

* cited by examiner

Primary Examiner — (Vikki) Hoa B Trinh
(74) Attorney, Agent, or Firm — Steven A. Shaw; W. James Brady; Frederick J. Telecky, Jr.

(57) ABSTRACT

A semiconductor system (200) of one or more semiconductor interposers (201) with a certain dimension (210), conductive vias (212) extending from the first to the second surface, with terminals and attached non-reflow metal studs (215) at the ends of the vias. A semiconducting interposer surface may include discrete electronic components or an integrated circuit. One or more semiconductor chips (202, 203) have a dimension (220, 230) narrower than the interposer dimension, and an active surface with terminals and non-reflow metal studs (224, 234). One chip is flip-attached to the first interposer surface, and another chip to the second interposer surface, so that the interposer dimension projects over the chip dimension. An insulating substrate (204) has terminals and reflow bodies (242) to connect to the studs of the projecting interposer.

2 Claims, 4 Drawing Sheets

PACKAGED SYSTEM OF SEMICONDUCTOR CHIPS HAVING A SEMICONDUCTOR INTERPOSER

This is a continuation application of application Ser. No. 12/119,276 filed May 12, 2008, which is a divisional of application Ser. No. 11/400,099, filed Apr. 7, 2006, now U.S. Pat. No. 7,390,700.

FIELD OF THE INVENTION

The present invention is related in general to the field of semiconductor devices and processes, and more specifically to low profile, vertically integrated package-on-package semiconductor systems.

DESCRIPTION OF THE RELATED ART

When semiconductor chips are to be mounted on substrates or interposers to form today's semiconductor packages, the substrates and interposers are commonly made of plastic or ceramic materials. These materials are especially preferred when the chip assembly technique employs the flip-chip method using solder balls to create the electrical connections between the chips and the substrate/interposer. When the assembled devices are then used or tested under conditions, which impose wide swings of temperature or humidity on the packages, significant failure rates may appear, characterized by cracks, especially at the solder joints, and delamination of the package parts.

Driven by the desire to reduce the board area needed to assemble a semiconductor device into electronic products such as hand-held telephones, today's semiconductor devices often use vertically stacked chips inside the packages. These chip stacks frequently include chips of significantly different sizes, assembled mostly by wire bonding techniques on interposers made of plastic or ceramic materials. The stack on the interposer is then assembled on substrates with solder balls for interconnection to external parts. The reliability failure rates due to solder joint cracks or parts delamination, observed for these devices under conditions of temperature cycles and high humidity, are especially high.

SUMMARY OF THE INVENTION

Applicants recognize as the main source of the reliability failure rates, observed in devices with chips assembled on plastic interposers, the material characteristics, especially the wide variation of the coefficients of thermal expansion (CTE) between plastic or ceramic materials and semiconductor materials (CTE of plastic or ceramic materials is between 7 to 10 times higher than CTE of silicon). The CTE discrepancy is diminished by using interposers made of semiconducting materials instead of plastic materials.

Applicants further recognize the need to shrink semiconductor devices both in two and in three dimensions, especially for a device-stacking and package-on-package method for semiconductor devices as well as electronic systems. In Applicant's approach, the resulting system offers improved speed and power capabilities by minimizing electrical resistances and inductances, and replacing wire bonding with flip-chip assembly. An additional advantage of semiconductor interposers is the opportunity to build active electronic devices and even integrated circuits into the surface of the interposers.

One embodiment of the invention is a semiconductor system, which has one or more semiconductor interposers with a certain dimension and conductive lines (preferably designed for power distribution) on the first and second surfaces. Conductive vias extend from the first to the second surface, with terminals and attached non-reflow metal studs at the ends of the vias, preferably copper studs on the first surface and gold studs on the second surface. One or more semiconductor chips have a dimension narrower than the interposer dimension, and an active surface with terminals and non-reflow metal studs. One chip is flip-attached to the first interposer surface, and another chip to the second interposer surface, so that the interposer dimension projects over the chip dimension. An insulating substrate has a third and a fourth surface with terminals; conductive lines are between the surfaces and conductive vias extend from the third to the fourth surface. Reflow bodies on the terminals of the third substrate surface connect to the studs on the second surface of the projecting interposer.

The first interposer surface may include discrete electronic components or an integrated circuit. Encapsulation material may cover the semiconductor chips, the semiconductor interposer, and portions of the third substrate surface.

Another embodiment is a method for fabricating a semiconductor system including the fabrication of one or more semiconductor interposers. A semiconductor wafer of a certain thickness has a first and a second surface; conductive lines and optionally discrete components or a circuit is made on the first surface. Via holes are formed to extend from the first surface downward to a certain depth. An insulating layer is then deposited over the first and the second surface including the via hole sidewalls. Semiconductor material is removed from the second wafer surface until the via holes are exposed. Copper is then deposited to fill the holes and form terminals on the first and second surfaces; non-reflow metal studs are deposited on the terminals. The wafer is finally singulated into individual interposers of a certain dimension.

One or more semiconductor chips with a dimension narrower than the interposer dimension are provided; they have an active surface and terminals with non-reflow metal studs. One chip is flip-attached to the first interposer surface so that the interposer dimension project over the chip dimension; the other chip is attached either the second interposer surface, or to the surface of the substrate. This insulating substrate has a third and a fourth surface with terminals, conductive lines between the surfaces, and conductive vias extending from the third to the fourth surface. Reflow bodies are deposited on the terminals of the third substrate surface; they are then contacted with the studs on the second surface of the projecting interposer and reflowed to attach the interposer to the substrate.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
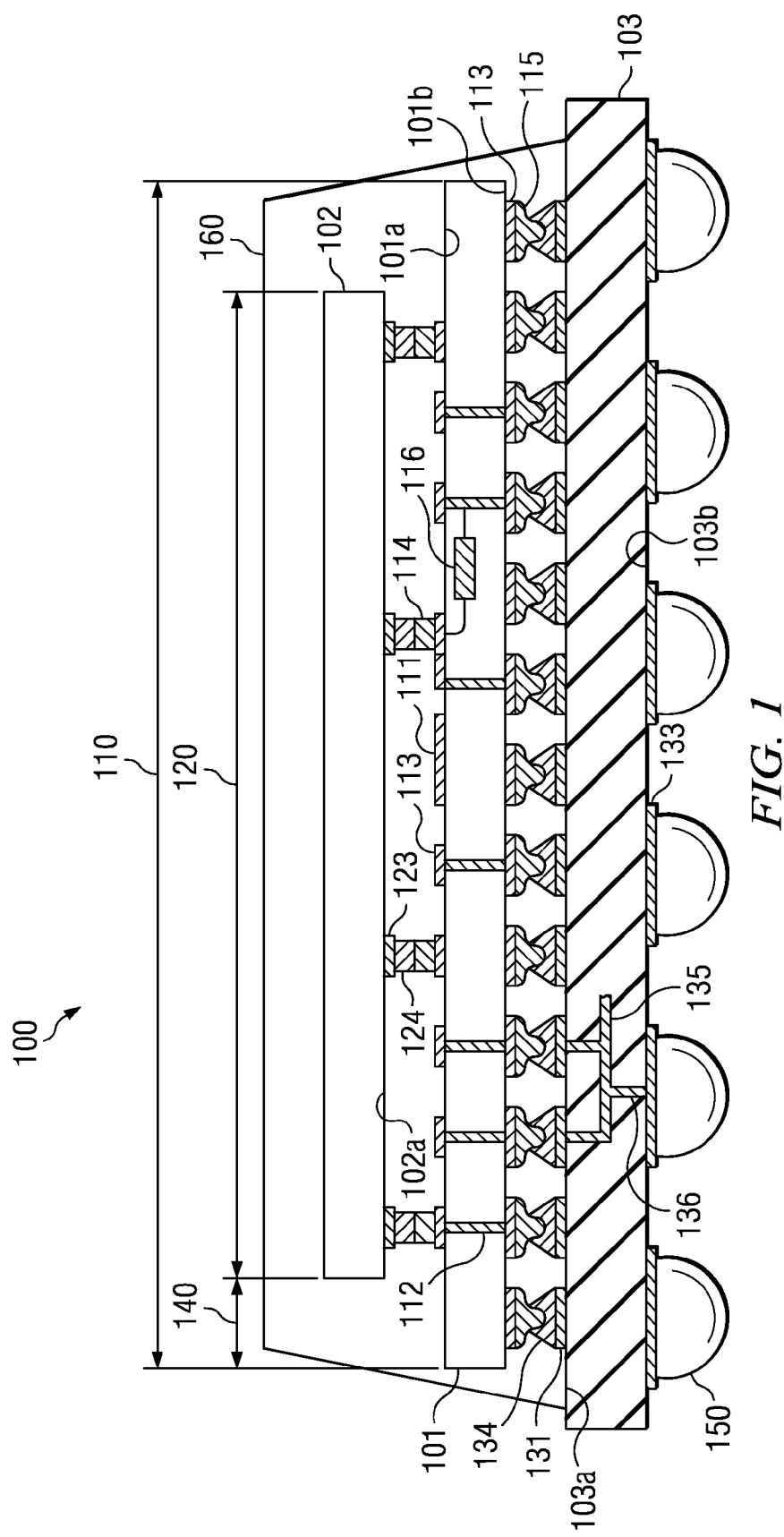
FIG. 1 illustrates a schematic cross section of a system with a semiconductor interposer flip-assembled on a substrate and a semiconductor chip flip-assembled on the interposer, wherein the chip has a dimension narrower than the interposer dimension.

FIG. 1 illustrates a semiconductor system, generally designated 100, which includes an interposer 101 made of semiconductor material, a semiconductor chip 102, and a substrate 103 with an insulating base material. Although silicon is the preferred semiconductor material, the invention applies to any semiconductor material, such as germanium, silicon germanium, gallium arsenide, or other III-V and II-IV compounds used in device fabrication.

Interposer 101 has a certain dimension designated 110; in FIG. 1, the dimension is the interposer length; in other examples, it could be the interposer width. Furthermore, interposer has a first surface 101a and a second surface 101b. On the first surface 101a and on the second surface 101b are a plurality of conductive lines for electrical communication, patterned from metal layers such as copper or aluminum; while detailed lines are not shown in FIG. 1, some portions are indicated by 111. Some lines may be patterned as power buses (low IR drop) to carry electrical currents for high power devices.

Contacting the lines are conductive vias 112, which extend from the first to the second surface. Vias 112 are metal-filled connections between surface 101a and surface 101b; preferably, they are copper-filled holes with insulating sidewalls to avoid unintentional contacts to the semiconducting base material. At the end of the vias or the lines are terminals 113, preferably made of copper.

Many terminals have metal studs attached, which are made of metals or alloys with melting temperatures considerably higher (above about 900° C.) than most semiconductor assembly temperatures. In the example of FIG. 1, the studs 114 on first interposer surface 101a are preferably made of copper, the studs 115 on second surface 101b preferably gold. In contrast to typical tin-based solders with melting temperatures between about 200 and 400° C., the stud metals are often referred to as non-reflow metals. Non-reflow studs can be manufactured with smaller size than solder-type connectors; the smaller stud size, in turn, allows finer pitch center-to-center; stud pitches less than 125 μm are feasible.

Figure 2:
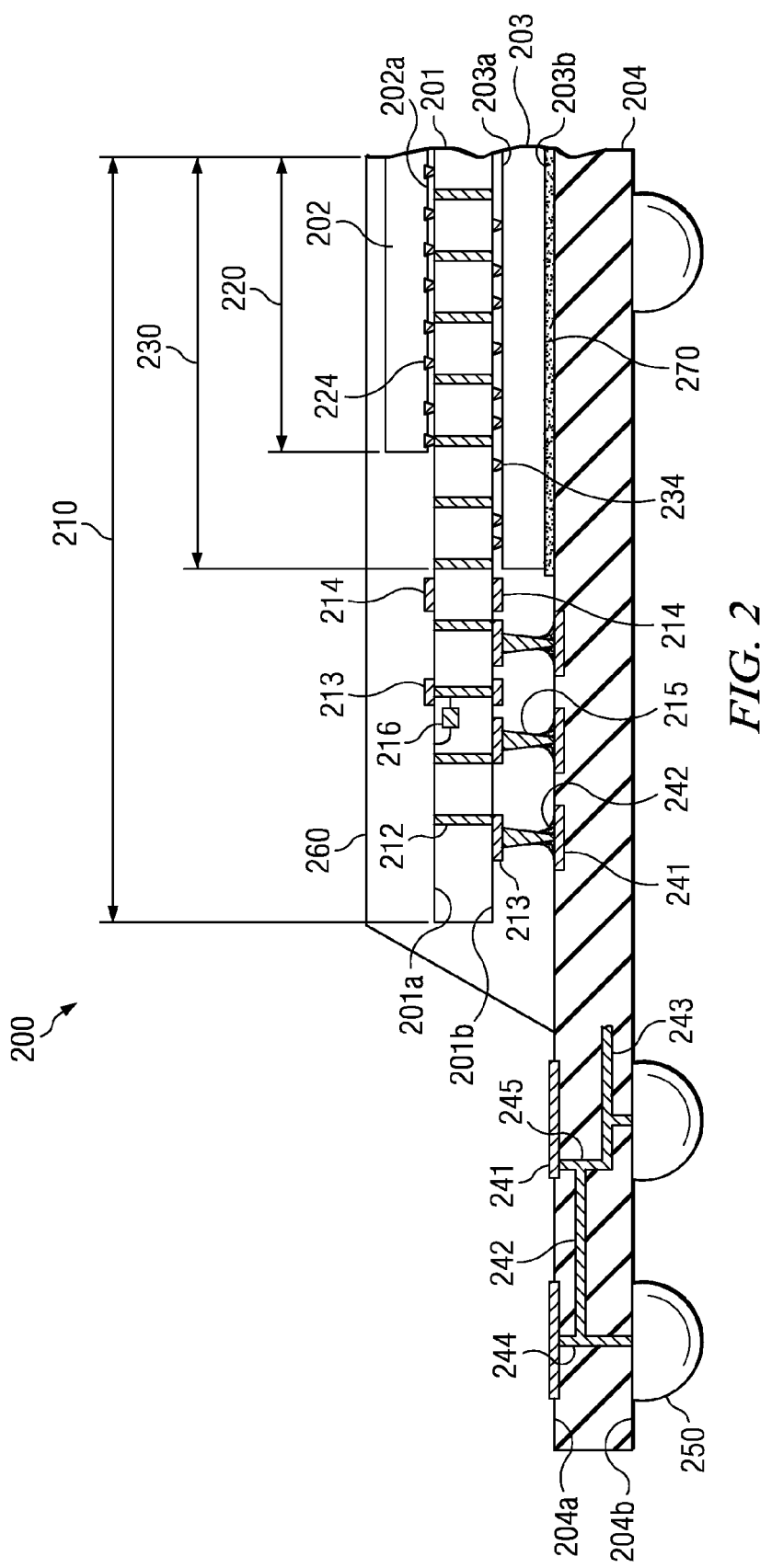
FIG. 2 is a schematic cross section of a system with a semiconductor interposer flip-assembled, two semiconductor chips flip-assembled on the interposer; the chips have a dimension narrower than the interposer dimension.
Figure 3:
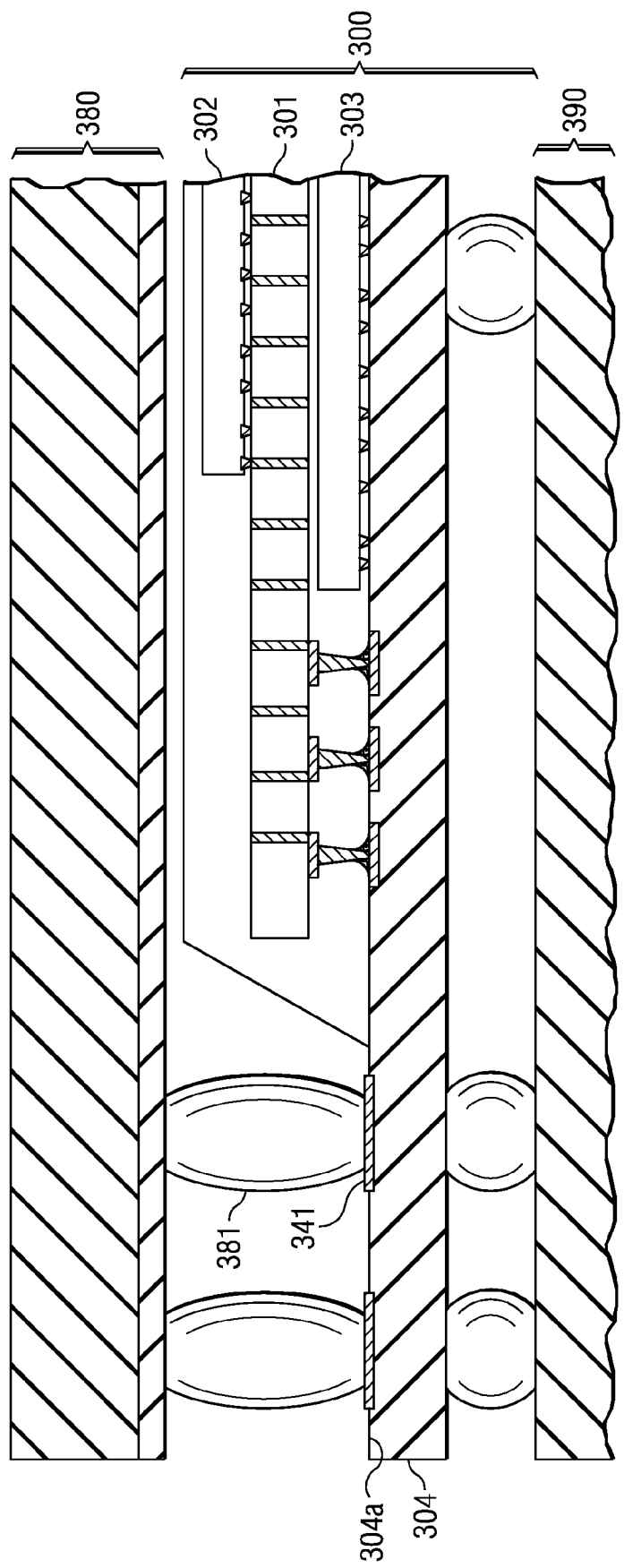
FIG. 3 shows a schematic cross section of a system similar to the system of FIG. 2, with external devices attached using solder bodies.
Figure 4:
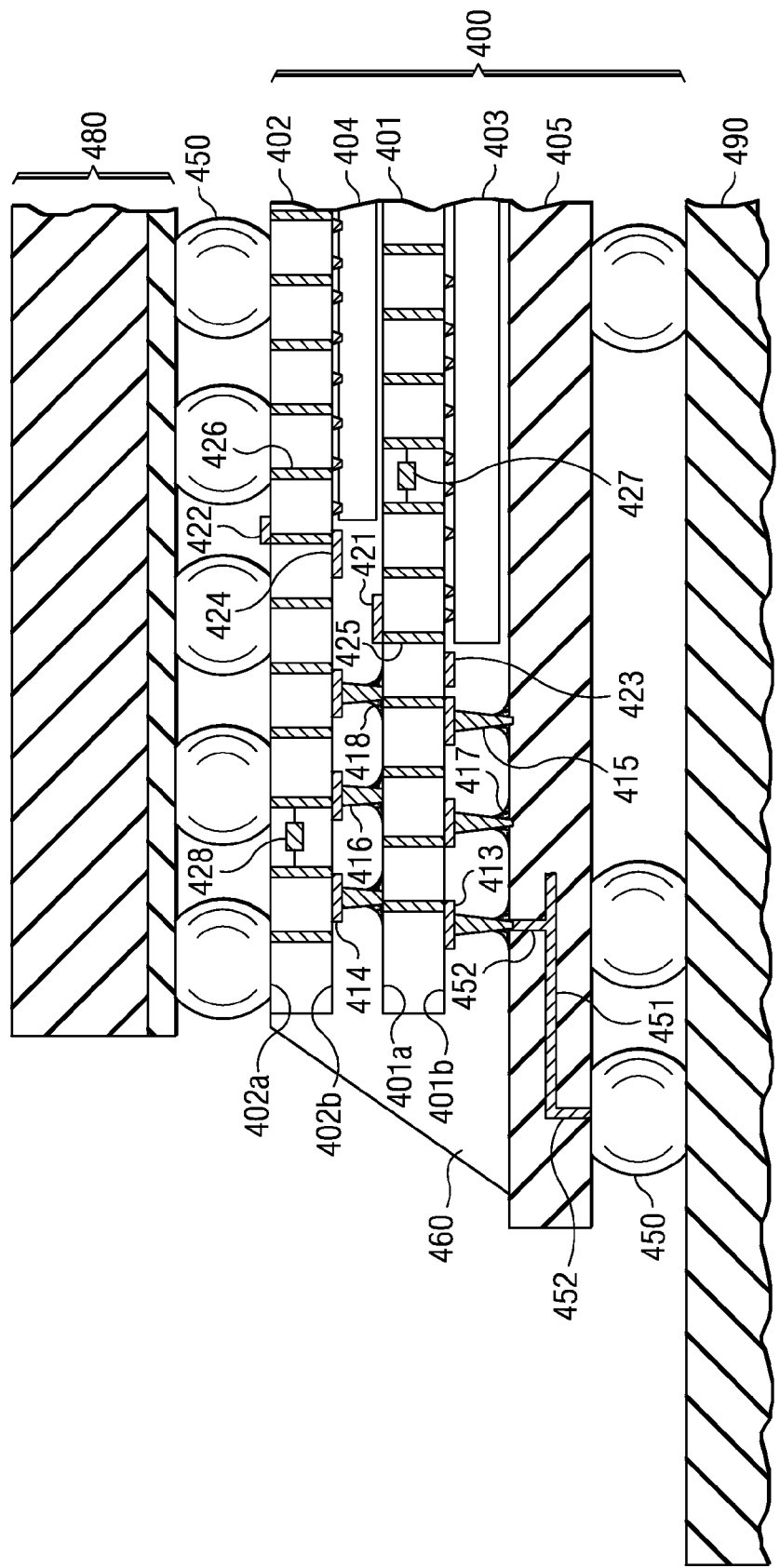
FIG. 4 illustrates a schematic cross section of a system with two semiconductor interposers, two semiconductor chips with dimensions narrower than the interposer dimension, and a substrate. The chips are flip-attached to the interposers, one substrate to the second one, which is attached to the substrate.

Chip 102 in FIG. 1 has a dimension 120; while chip dimension 120 may be approximately equal to interposer dimension 110, it is advantageous to have dimension 120 narrower than the interposer dimension 110, in order to provide space for additional contacts between interposer 101 and substrate 103 in multi-chip arrangements (see FIGS. 2, 3, and 4). Chip 102 further has an active surface 102a, which includes the semiconductor device (for instance, an integrated circuit) and input/output terminals 123. Terminals 123 are preferably made of copper and have non-reflow metal studs 124 attached. These studs are made of gold or, preferably, copper with a surface metallurgically suitable for direct attach to the interposer studs 114.

As FIG. 1 illustrates, chip 102 is attached to the first interposer surface 101a so that the interposer dimension 110 projects over the chip dimension 120 by the length 140. The projection of the interposer may be symmetrical around the chip periphery, or asymmetrical.

System 100 has a substrate 103 made of an insulating base material with third surface 103a and fourth surface 103b. On third surface 103a are terminals 131, and on fourth surface 103b are terminals 133. The preferred metal for the terminals is copper with a surface metallurgically suitable for solder attachment (preferably one or more layers of nickel, palladium, or gold). Substrate 103 further has conductive lines between the surfaces; while detailed lines are not shown in FIG. 1, some portions are indicated by 135. Substrate 103 also has conductive vias extending from the third to the fourth surface (detailed vias not shown in FIG. 1, some portions indicated by 136), which may contact the lines. Bodies 134 of reflow metals (preferably tin-based alloys) are on terminals 131. They enable reliable electrical contact to the studs 115 on the second surface 101b of interposer 101.

As FIG. 1 indicates, reflow bodies (solder balls) 150 may be attached to the terminals on the fourth surface 103b. In addition, an encapsulation material 160, such as a molding compound, may be covering semiconductor chip 102, semiconductor interposer 101, and portions of the third substrate surface 103a. In devices, which use such encapsulation, the material serves the dual purpose of stress-absorbing underfill in the gap between chip 102 and the interposer 101, and the gap between the interposer 101 and the substrate 103, protecting the studs 124, 114, and 115.

It should be pointed out that the use of an encapsulation material 160 is optional.

One advantage of using a semiconductor material for the interposer is the minimization of thermo-mechanical stresses exerted on semiconductor chip 102 due to the similar coefficients of thermal expansion of interposer and chip. As another advantage, the semiconductor interposer facilitates the incorporation of discrete electronic components or even complete integrated circuits in the first interposer surface 101a. While detailed components/circuits are not shown in FIG. 1, some portion is indicated by 116. Components or circuits included in surface 101a can take advantage of the fact that interposer 101 has terminals and contacts on both surfaces 101a and 101b and interconnections between the surfaces (the process steps for fabricating an interposer with an integrated circuit and metal-filled vias are described below).

The advantage of a semiconductor interposer with dimensions larger than the dimensions of semiconductor chips for assembling an electronic system becomes evident from FIGS. 2 to 4. FIGS. 2 and 3 illustrate semiconductor systems 200 and 300 with two semiconductor chips and a semiconductor interposer; in FIG. 3, system 300 assembled with an additional device 380 on an external part 390.

Semiconductor system 200 in FIG. 2 includes an interposer 201 made of semiconductor material, a first semiconductor chip 202, a second semiconductor chip 203, and a substrate 204 made of an insulating base material. Interposer 201 has preferably a thickness between about 30 and 60 μm; it further has a certain dimension, of which only the portion designated 210 is shown in FIG. 2. Furthermore, interposer has a first surface 201a and a second surface 201b. On the first surface 201a and on the second surface 201b is a plurality of conductive lines (only portions 214 shown in FIG. 2) for electrical communication, patterned from metal layers such as copper or aluminum.

Contacting the lines are conductive vias 212, which extend from the first to the second surface. Vias 212 are metal-filled connections between surface 201a and surface 201b; preferably, they are copper-filled holes with insulating sidewalls to avoid unintentional contacts to the semiconducting base material. At the end of the vias or the lines are terminals 213, preferably made of copper.

Many terminals have metal studs attached, which are made of metals or alloys with melting temperatures considerably higher (above about 900° C.) than most semiconductor assembly temperatures. In the example of FIG. 2, the studs 215 on second surface 201b may be made of copper or, more preferred, gold. Non-reflow studs can be manufactured with smaller size than reflow (solder-type) connectors; the smaller stud size, in turn, allows finer pitch center-to-center, in particular when the studs are created from gold in wire bonding. Stud pitches less than 125 μm are feasible.

First chip 202 may be as thin as approximately 50 μm; it has a lateral dimension, of which a portion 220 is shown in FIG. 2. Second chip 203 may also be as thin as about 50 μm and have a lateral dimension, with portion 230 shown in FIG. 2. It is advantageous to have dimensions 220 and 230 narrower than the interposer dimension 210, in order to provide space for additional contacts between interposer 201 and substrate 203 in multi-chip arrangements. In some devices, portion 220 may be equal to or larger than portion 210.

Chip 202 further has an active surface 202a, which includes the semiconductor device (for instance, an integrated circuit) and input/output terminals. The terminals have non-reflow metal studs 224 attached. These studs are preferably made of gold and are about 5 to 10 μm tall. Chip 203 has an active surface 203a, which includes the semiconductor device (for example, an integrated circuit) and input/output terminals. The terminals have non-reflow metal studs 234 attached; the studs are preferably made of gold and also about 5 to 10 μm tall.

As FIG. 2 illustrates, first chip 202 is attached to the first interposer surface 201a so that the interposer dimension 210 projects over the chip dimension 220 by a certain length. The projection of the interposer may be symmetrical around the chip periphery, or asymmetrical. The attachment is performed by flipping the chip to have its active surface 202a face first surface 201a of the interposer. Second chip 203 is attached to the second interposer surface 201b so that the interposer 210 projects over the chip dimension 230. The projection of the interposer may be symmetrical around the chip periphery, or asymmetrical. The attachment is performed by the flip-chip method so that active surface 203a is facing the second substrate surface 201b. In addition, the passive surface 203b of the second chip is attached the substrate 204 by an adhesive material 270, about 15 to 25 μm thick.

Due to the interposer projection over the dimension at least of the second chip, the studs 215 on the second interposer surface 201b remain operable to connect to the reflow bodies on the third substrate terminals.

System 200 has a substrate 204 made of an insulating base material between about 200 and 300 μm thick with third surface 204a and fourth surface 204b. On third surface 204a are terminals 241, and on fourth surface 204b are also terminals (not shown in FIG. 2). The preferred metal for the terminals is copper with a metallurgical surface suitable for solder attachment (preferably one or more layers of nickel, palladium, or gold). Substrate 204 further has conductive lines between the surfaces (only portions 242, 243 shown in FIG. 2) and conductive vias extending from the third to the fourth surface (only portions 244, 245 shown in FIG. 2), which may contact the lines. Bodies 242 of reflow metals (preferably tin-based alloys) are on some terminals 241. They enable reliable electrical contact to the studs 215 on the second surface 201b of interposer 201. Other contacts 241 remain available for solder attachment of external devices (see FIG. 3).

As FIG. 2 indicates, reflow bodies (solder balls) 250 may be attached to the terminals on the fourth surface 204b; their diameter is between about 180 and 250 μm and may have a pitch of about 500 μm center-to-center. In addition, an encapsulation material 260, such as a molding compound, may be covering semiconductor chips 202 and 203, semiconductor interposer 201, and portions of the third substrate surface 204a. The encapsulation material may have a thickness of about 40 to 70 μm above first chip 202. In devices, which use such encapsulation, the material serves the dual purpose of stress-absorbing underfill in the gaps between chips 202 203 and the interposer, and the gap between the interposer and the substrate, protecting the studs 224, 234, and 215.

The use of an encapsulation material 260 is optional. Since semiconductor material is employed for the interposer, it keeps thermo-mechanical stresses exerted on semiconductor chips 202 and 203 to a minimum; the coefficients of thermal expansion of interposer and chips are essentially equal.

The semiconductor nature of the interposer material facilitates the incorporation of discrete electronic components or even complete integrated circuits in the first interposer surface 201a; FIG. 2 shows only component portion 216. Components or circuits included in surface 201a can take advantage of the fact that interposer 201 has terminals and contacts on both surfaces 201a and 201b and interconnections between the surfaces.

The thickness of the packaged device in the absence of wire bonding but including the encapsulation material, is between about 200 and 250μ; the overall thickness of system 200, including the substrate and the solder balls, is between about 650 and 750 μm.

The embodiment of the invention designated 300 in FIG. 3 is similar to the embodiment 200 in FIG. 2, except for the flip-chip attachment of second chip 303 to substrate 304 rather than to interposer 301. In addition, FIG. 3 shows an external device 380 attached by reflow members 381 to terminals 341 on the substrate surface 304a. In the illustration, the reflow members are chosen to be about 250 to 300 μm tall, slightly more than the thickness of the packaged device due to the gap (approximately 50 μm) between the encapsulation material of the packaged device and the external device 380. As an example, the reflow members may have a pitch center-to-center of about 620 to 700 μm. The external device may have a thickness of approximately 500 to 600 μm. System 300 and external device 380 may have a total thickness of about 1.2 to 1.3 mm.

Another embodiment of the invention, illustrated in FIG. 4, is a semiconductor system 400, which includes a first interposer 401 made of semiconductor material, a second interposer 402 made of semiconductor material, a first semiconductor chip 403, a second semiconductor chip 404, and a substrate 405 made of an insulating base material. Although silicon is the preferred semiconductor material, the invention applies to any other semiconductor material used in device fabrication.

Interposers 401 and 402 each have preferably a thickness between about 30 and 60 μm and a certain dimension, of which only a portion designated is shown in FIG. 4. Furthermore, each interposer has a first surface (401a and 402a, respectively) and a second surface (401b and 402b, respectively) with conductive lines (only portions 421, 422, 423, 424 shown in FIG. 4). Conductive, metal-filled vias (425, 426) extend from the first to the second surface. Connected to the vias are terminals, preferably made of copper; FIG. 4 depicts only a few of these terminals, designated 413 on the first interposer, and 414 on the second interposer.

The semiconductor nature of the interposer material facilitates the incorporation of discrete electronic components and even complete integrated circuits (427, 428) in the first interposer surface (401*a*, 402*a*). Components or circuits included in surface 401*a* and/or 402*a* can take advantage of the fact that interposers 401 and 402 have terminals and contacts on both surfaces 401*a* and 401*b*, and 402*a* and 402*b*, and conductive via interconnections between the surfaces.

Many terminals have metal studs attached, which are made of metals or alloys with melting temperatures considerably higher (above about 900° C.) than most semiconductor assembly temperatures. In the example of FIG. 4, the studs 415 and 416 on the second interposer surfaces may be made of copper or, more preferred, gold. Stud pitches less than 125 µm are feasible.

First chip 403, between about 25 to 50 µm thick, has a lateral dimension narrower than the dimension of the interposers. Second chip 404, also between about 25 and 50 µm thick, may have the same lateral dimension as chip 403, or a different one, but it is advantageous to have the dimensions narrower than the interposer dimension in order to provide space for additional contacts between interposer-to-interposer or from interposer to substrate in multi-chip arrangements.

Chip 403 and chip 404 have an active surface with input/output terminals. The terminals have non-reflow metal studs attached, which are preferably made of gold and are about 5 to 10 µm tall.

As FIG. 4 illustrates, first chip 403 is attached to the first interposer 401 so that the interposer dimension projects over the chip dimension by a certain length. The projection of the interposer may be symmetrical around the chip periphery, or asymmetrical. The attachment is performed by flipping the chip to have its active surface face second surface 40*b* of the interposer. By this flip-attachment, a first subsystem is formed.

Second chip 404 is attached to the second interposer 402 so that the interposer projects over the chip dimension by a certain length. The projection of the interposer may be symmetrical around the chip periphery, or asymmetrical. The attachment is performed by the flip-chip method so that the active chip surface is facing the second substrate surface 402*b*. By this flip-attachment, a second subsystem is formed.

Due to the interposer projections over the dimensions of the first and the second chip, studs 415 of interposer 401 remain operable to connect to reflow bodies 417 on substrate 405. Likewise, studs 416 of interposer 402 remain operable to connect to reflow bodies 418 on interposer 401.

System 400 has a substrate 405 made of an insulating base material between about 200 and 300 µm thick. On the substrate surfaces are terminals (preferably copper) with a metallurgical surface suitable for solder attachment (preferably one or more layers of nickel, palladium, or gold). Substrate 405 further has conductive lines 451 between the surfaces and conductive vias 452 extending from one surface to the opposite surface. Bodies 417 of reflow metals (preferably tin-based alloys) are on some terminals for connection to an interposer; other terminals have reflow members, preferably tin-based solder balls, for attachment to external parts 490.

Encapsulation material 460, such as a molding compound, may be covering semiconductor chips 403 and 404, semiconductor 401 and one surface of interposer 402, and portions of the substrate surface. In devices, which use such encapsulation, the material serves not only the purpose of protection, but also the dual purpose of stress-absorbing underfill in the gaps between the chips and the interposers.

The use of an encapsulation material 460 is optional. One advantage that a semiconductor material is employed for the interposers is to minimize thermo-mechanical stresses exerted on semiconductor chips 403 and 404 due to the substantially equal coefficients of thermal expansion of interposers and chips.

The assembled chips and interposers of FIG. 4, encapsulated in molding material, have a total thickness between about 150 and 190 µm; the complete system 400 has an approximate thickness of about 600 to 700 µm.

On the terminals of the substrate surface 402*a*, which is not covered by the encapsulation material, reflow members 451 may be attached in order to connect to an external device 480. Members 450 and 451 may have a diameter of approximately 200 µm, and a pitch center-to-center of about 500 µm.

Another embodiment of the invention is a method for fabricating a semiconductor system, which employs semiconductor interposers. The initial phase of the fabrication manufactures the semiconductor interposers. A semiconductor wafer is provided, preferably a silicon wafer. The wafer has a first and a second surface and a thickness convenient for high-yield wafer processing, for instance 375 to 500 µm. By applying standard front-end wafer process steps, a plurality of conductive lines, or discrete components, or even an integrated circuit may be fabricated on the first surface of the wafer.

Close to the end of the sequence of front-end process steps, before the step of depositing the protective overcoat, via holes are formed from the first wafer surface downward to a certain depth. The preferred technique is preferential chemical etching, since this technique is a batch process; alternative methods include laser drilling. The via holes have side walls, which receive an insulating layer by the process step of forming a protective overcoat over the wafer surface.

Semiconductor material is then removed, starting from the second wafer surface and continuing until the downward ends of the via holes are exposed. The preferred method is mechanical back-grinding of the wafer. Next the via holes are filled with metal, preferably by depositing copper. At the end of the filling step, terminals on the first and second wafer surfaces are formed by depositing and patterning a metal (for instance, copper) layer.

On selected terminals, non-reflow metal studs are deposited. The term non-reflow refers metals or alloys with melting temperatures considerably higher (above about 900° C.) than most semiconductor assembly temperatures. Preferred metals include copper and gold, which are in contrast to typical tin-based solders with melting temperatures between about 200 and 400° C.

Non-reflow studs can be manufactured with smaller size than solder-type connectors; the smaller stud size, in turn, allows finer pitch center-to-center, in particular when the studs are created from gold or copper balls in wire bonding. Stud pitches less than 125 µm are feasible. In the wire ball technology, the free-air ball has preferably a diameter between 1.2 to 1.6 wire diameters; after attachment and flattening, the resulting ball diameter is between about 40 and 70 µm for wire diameters between about 12 and 33 µm, preferably between 18 and 25 µm.

In the next process step, the wafer is singulated, for example by sawing, into individual interposers having the desired lateral dimensions.

A first semiconductor chip is then provided, which has a dimension narrower than the interposer dimension, an active surface, and terminals with non-reflow metal studs on the active surface. If required by the assembly the system, a second semiconductor chip is provided, which also has a dimension narrower than the interposer dimension, an active surface, and terminals with non-reflow metal studs on the active surface. The dimension of the second chip may be equal to, or different from the dimension of the first chip.

The first chip is attached by flip-chip technology to the first interposer surface so that the interposer dimension projects over the chip dimension. The second chip is, in some devices, flip-attached to the second interposer surface so that the interposer dimension projects over the chip dimension and studs on the second interposer surface remain operable to connect to the reflow bodies on the substrate terminals. In other devices, the second chip is flip-attached to the substrate so that the interposer dimension projects over the chip dimension and reflow bodies on the substrate terminals remain operable to connect to the studs on the second interposer surface.

An insulating substrate is provided, which has a third and a fourth surface with terminals, conductive lines distributed between the surfaces, and conductive vias extending from the third to the fourth surface and contacting the lines. Reflow bodies are deposited on the terminals of the third substrate surface. The studs on the second surface of the projecting interposer are contacted with the reflow bodies on the third substrate surface, and the bodies are reflowed around the studs in order to attach the interposer to the substrate.

An optional process step involves the encapsulation of the device for protection and stress reduction purposes. Packaging material, preferably a molding compound, encapsulates the chip, the interposer, and portions of the third substrate surface. Finally, reflow bodies, preferably solder balls, may be attached to the terminals on the fourth substrate surface.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiment.

We claim:

1. A method for fabricating a semiconductor system, comprising the steps of:
    etching a plurality of via holes of a first depth from a first surface of a semiconductor wafer;
    covering sidewalls of the via holes with an insulating layer;
    filling the via holes with copper metal;
    removing semiconductor material from a second surface of the wafer opposite the first surface to reduce the thickness of the wafer to less than the first depth;
    singulating the wafer into individual interposers;
    attaching an active surface of a first semiconductor chip on a first surface of a semiconductor interposer;
    positioning the interposer over a substrate and joining a second surface of the interposer to a plurality of terminals on the substrate with non-reflow metal studs extended from the copper filler with a reflow material.

2. The method according to claim 1 further including the step of encapsulating the chip, the interposer, and portions of the substrate in an encapsulating material.

* * * * *